US012616032B2

(12) United States Patent
Yu et al.

(10) Patent No.: US 12,616,032 B2
(45) Date of Patent: Apr. 28, 2026

(54) ELECTROMAGNETIC SHIELDING STRUCTURE, MANUFACTURING METHOD, AND COMMUNICATION TERMINAL

(71) Applicant: VANCHIP (TIANJIN) TECHNOLOGY CO., LTD., Tianjin (CN)

(72) Inventors: Ying Yu, Tianjin (CN); Yunfang Bai, Tianjin (CN)

(73) Assignee: VANCHIP (TIANJIN) TECHNOLOGY CO., LTD., Tianjin (CN)

( * ) Notice: Subject to any disclaimer, the term of this patent is extended or adjusted under 35 U.S.C. 154(b) by 149 days.

(21) Appl. No.: 18/415,656

(22) Filed: Jan. 18, 2024

(65) Prior Publication Data

US 2024/0234337 A1     Jul. 11, 2024

Related U.S. Application Data

(63) Continuation of application No. PCT/CN2022/142995, filed on Dec. 28, 2022.

(51) Int. Cl.
*H01L 23/552* (2006.01)
*H01L 21/48* (2006.01)
(Continued)

(52) U.S. Cl.
CPC ........ *H01L 23/552* (2013.01); *H01L 21/4853* (2013.01); *H01L 21/486* (2013.01);
(Continued)

(58) Field of Classification Search
CPC . H01L 23/552; H01L 21/4853; H01L 21/486; H01L 21/565; H01L 23/293;
(Continued)

(56) References Cited

U.S. PATENT DOCUMENTS 5,679,975 A * 10/1997 Wyland ................. H01L 23/645
257/659
5,986,340 A * 11/1999 Mostafazadeh ....... H01L 23/552
257/713
(Continued)

FOREIGN PATENT DOCUMENTS

CN          112234048 B * 2/2021 ............. H01L 21/50

*Primary Examiner* — Rockshana D Chowdhury
*Assistant Examiner* — Martin Antonio Asmat Uceda
(74) *Attorney, Agent, or Firm* — George Guosheng Wang; Upstream Research and Patent LLC

(57)          ABSTRACT

Disclosed in the present invention are an electromagnetic shielding structure, a manufacturing method and a communication terminal. The electromagnetic shielding structure comprises a module substrate, which is formed with a plurality of grounding holes penetrating through the module substrate, and the plurality of grounding holes jointly define a mounting area; a device to be shielded, which is attached to the module substrate and located in the mounting area; a plurality of grounding bonding pads, which are respectively arranged in the grounding holes in a penetrating manner; and a plurality of wires, wherein the two ends of each wire are respectively connected to two different grounding bonding pads, such that the plurality of wires jointly form a shielding layer erected above the device to be shielded.

9 Claims, 3 Drawing Sheets

(51) Int. Cl.

| | |
|---|---|
| *H01L 21/56* | (2006.01) |
| *H01L 23/29* | (2006.01) |
| *H01L 23/31* | (2006.01) |
| *H01L 23/498* | (2006.01) |
| *H01L 23/66* | (2006.01) |
| *H01L 25/065* | (2023.01) |

(52) U.S. Cl.
CPC .......... *H01L 21/565* (2013.01); *H01L 23/293* (2013.01); *H01L 23/3121* (2013.01); *H01L 23/49811* (2013.01); *H01L 23/49827* (2013.01); *H01L 23/49838* (2013.01); *H01L 23/66* (2013.01); *H01L 25/0655* (2013.01); *H01L 2223/6611* (2013.01); *H01L 2223/6616* (2013.01)

(58) Field of Classification Search
CPC .......... H01L 23/3121; H01L 23/49811; H01L 23/49827; H01L 23/49838; H01L 23/66; H01L 25/0655; H01L 2223/6611; H01L 2223/6616
See application file for complete search history.

(56) References Cited

U.S. PATENT DOCUMENTS

| | | | | |
|---|---|---|---|---|
| 6,486,534 | B1 * | 11/2002 | Sridharan | H01L 23/49816 |
| | | | | 257/659 |
| 9,761,537 | B2 * | 9/2017 | Chen | H01L 24/45 |
| 10,076,023 | B2 * | 9/2018 | Choi | H01F 27/363 |
| 10,141,269 | B2 * | 11/2018 | Jeon | H01L 21/4889 |
| 10,285,258 | B2 * | 5/2019 | Choi | H01F 27/36 |
| 11,024,559 | B2 * | 6/2021 | Heppner | H01L 23/48 |
| 11,264,353 | B2 * | 3/2022 | Seki | H01L 24/73 |
| 11,348,894 | B2 * | 5/2022 | Otsubo | H01L 24/48 |
| 11,515,282 | B2 * | 11/2022 | Lear | H01L 24/49 |
| 2015/0223322 | A1 * | 8/2015 | Ziglioli | H01L 23/13 |
| | | | | 361/728 |
| 2016/0300660 | A1 * | 10/2016 | Chiu | H01F 27/022 |
| 2019/0393166 | A1 * | 12/2019 | Otsubo | H01L 23/5383 |
| 2023/0230951 | A1 * | 7/2023 | Otsubo | H01L 23/645 |
| | | | | 257/678 |

* cited by examiner

ELECTROMAGNETIC SHIELDING STRUCTURE, MANUFACTURING METHOD, AND COMMUNICATION TERMINAL

BACKGROUND

Technical Field

The present invention relates to the field of integrated circuit technologies, and relates to an electromagnetic shielding structure, and to a manufacturing method for the electromagnetic shielding structure and a communication terminal using the electromagnetic shielding structure.

Related Art

Various modules and chips with different functions are integrated on a conventional communication terminal, such as a baseband chip, a radio frequency transmitting and receiving chip, a power management chip, a GSM radio frequency power amplifier module, a radio frequency power amplifier chip for different frequency bands of 3G/4G, and a radio frequency power amplifier chip for different frequency bands of 5G. To prevent different modules from affecting performance of each other during working, a shielding cover is usually added between different modules to isolate the modules. However, performance of the radio frequency power amplifier modules may be affected to different extents after the shielding cover is added. To reduce such impacts, device manufacturers may increase a height of the shielding cover or open holes on the shielding cover.

In addition, as current communication terminals become increasingly thinner, and there is an increasing quantity of integrated frequency bands, a shielding cover needs to be manufactured with an increasingly lower height and a hole cannot be opened. To solve this problem, an electromagnetic shield layer is usually added on a module by current chip and module manufacturers. In addition, during a package stage, a plastic package and slotting operation need to be performed many times, and a metal ion plating process is added, resulting in increased difficulties and costs in packaging and manufacturing chip modules. This is not conducive to market popularity and application of chip modules.

SUMMARY

A primary technical problem to be solved by the present invention is to provide an electromagnetic shielding structure which is easy to manufacture and has low production costs.

Another technical problem to be solved by the present invention is to provide a manufacturing method for the foregoing electromagnetic shielding structure.

Still another technical problem to be solved by the present invention is to provide a communication terminal using the foregoing electromagnetic shielding structure.

To realize the foregoing objectives, the following technical solutions are used in the present invention.

According to a first aspect of embodiments of the present invention, an electromagnetic shielding structure is provided, including:

a module substrate, where a plurality of ground holes running through the module substrate are provided on the module substrate, and the plurality of ground holes jointly define a mounting area;

a to-be-shielded component, mounted on the module substrate and located in the mounting area;

a plurality of ground pads, where each ground pad is disposed in a respective ground hole; and a plurality of wires, where two ends of each wire are respectively connected to two different ground pads, to enable the plurality of wires to jointly form a shield layer arranged over the to-be-shielded component.

Preferably, the plurality of ground holes are divided into M groups. Each group of ground holes define a mounting area. The mounting areas are not overlapped with each other. M is a positive integer.

Preferably, a quantity of the to-be-shielded components is M. Each to-be-shielded component is located in a respective mounting area.

Preferably, the mounting area is an enclosed area. The plurality of wires are divided into two groups. Each wire in one group of wires is arranged over the to-be-shielded component in a first direction. Each wire in the other group of wires is arranged over the to-be-shielded component in a second direction. A set included angle α is formed between the first direction and the second direction.

Preferably, a value of the set included angle α ranges from 0° to 90°.

Preferably, the mounting area is an open area. The plurality of wires are divided into two groups. Each wire in one group of wires is arranged over the to-be-shielded component in a third direction. Each wire in the other group of wires is connected between two adjacent ground pads.

Preferably, a height of each wire is adjustable, so that a distance between the shield layer and the to-be-shielded component is adjustable.

Preferably, the electromagnetic shielding structure further includes a plastic package body. The plastic package body is injection molded on the module substrate to seal the shield layer and the to-be-shielded component.

According to a second aspect of embodiments of the present invention, a manufacturing method for an electromagnetic shielding structure is provided, including the following steps:

mounting a to-be-shielded component on a pre-manufactured module substrate, to enable the to-be-shielded component to be located in a mounting area of the module substrate, where a plurality of ground holes running through the module substrate are provided on the pre-manufactured module substrate, and the plurality of ground holes jointly define the mounting area;

disposing a plurality of ground pads in the plurality of ground holes of the module substrate in sequence; and connecting two ends of one wire to two different ground pads respectively, and repeating the step until a plurality of wires jointly forming a shield layer arranged over the to-be-shielded component, to form the foregoing electromagnetic shielding structure.

According to a third aspect of embodiments of the present invention, a communication terminal is provided, including the foregoing electromagnetic shielding structure.

Compared with conventional technologies, the electromagnetic shielding structure provided in the present invention can achieve a good shielding effect by using the shield layer formed by the plurality of wires. In this way, an impact of outward radiation of a signal of the to-be-shielded component on another chip can be reduced, and an impact of another chip on the to-be-shielded component can also be reduced. In addition, the wires of the electromagnetic shielding structure can be implemented by common wire bonding without increasing costs of the electromagnetic shielding structure. Furthermore, for the electromagnetic shielding structure, there is no need to add additional shielding materials or package processes, so that the manufacturing process is simple, thereby improving convenience and efficiency of production. Finally, a height of each wire is adjustable, so that a distance between the shield layer and the to-be-shielded component is adjustable. In this way, the electromagnetic shielding structure can be made lighter and thinner, thereby facilitating extensive application of the electromagnetic shielding structure in current ultra-thin and compact communication terminals.

DETAILED DESCRIPTION

The following describes technical contents of the present invention in detail with reference to accompanying drawings and specific embodiments.

Figure 1:
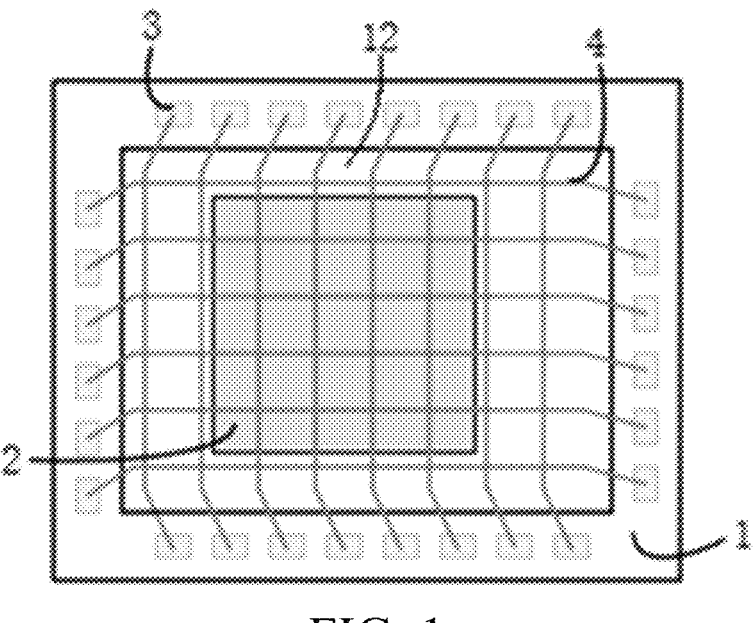
FIG. 1 is a schematic diagram of a structure of an electromagnetic shielding structure according to a first embodiment.

FIG. 1 shows an electromagnetic shielding structure provided in a first embodiment, including at least a module substrate 1, a to-be-shielded component 2, a plurality of ground pads 3, and a plurality of wires 4.

Figure 2:
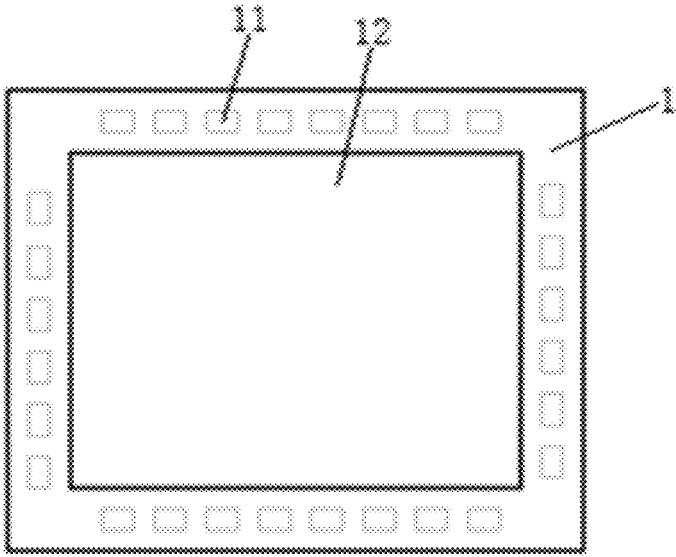
FIG. 2 is a schematic diagram of a structure of a module substrate in a first embodiment.

Refer to FIG. 2. In a direction perpendicular to a surface of the module substrate 1, a plurality of ground holes 11 running through the module substrate 1 are provided on the module substrate 1. The plurality of ground holes 11 jointly define a mounting area 12. The to-be-shielded component 2 is mounted on the module substrate 1 and located in the mounting area 12. Each ground pad 3 is disposed in a respective ground hole 11. Two ends of each wire 4 are respectively connected to two different ground pads 3, to enable the plurality of wires 4 to jointly form a shield layer arranged over the to-be-shielded component 2.

Therefore, a good shielding effect can be achieved by using the shield layer formed by the plurality of wires 4. In this way, an impact of outward radiation of a signal of the to-be-shielded component 2 on another chip can be reduced, and an impact of another chip on the to-be-shielded component 2 can also be reduced. The wires 4 of the electromagnetic shielding structure can be implemented by common wire bonding without increasing costs of the electromagnetic shielding structure. In addition, for the electromagnetic shielding structure in embodiments of the present invention, there is no need to add additional shielding materials or package processes, so that the manufacturing process is simple, thereby improving convenience and efficiency of production.

In this embodiment of the present invention, the mounting area 12 is an enclosed area. The enclosed area means that an overall shape jointly defined by the plurality of ground holes

11 is an enclosed shape. For example, the plurality of ground holes 11 jointly define a polygon shape, a circular shape, an elliptical shape, a triangular shape, and the like. In addition, it may be understood that for the plurality of ground holes 11 that define the mounting area 12, a specific interval exists between two adjacent ground holes 11, for example, 1 cm to 2 cm. The interval may be adjusted adaptively based on requirements and does not affect an overall shape of the mounting area 12.

As shown in FIG. 1, the module substrate 1 is in a rectangular shape. The plurality of ground holes 11 are provided on four sides (that is, an upper side, a lower side, a left side, and a right side) of the rectangular module substrate 1, to jointly define the rectangular mounting area 12. In addition, the plurality of wires 4 are divided into two groups. In one group of wires, two ends of each wire 4 cross over the to-be-shielded component 2 in an A direction, and are respectively connected to two ground pads 3 on the upper side and the lower side. In this way, the plurality of wires 4 in one group of wires are arranged over the to-be-shielded component 2 in the A direction. In the other group wires, two ends of each wire 4 cross over the to-be-shielded component 2 in a B direction, and are respectively connected to two ground pads 3 on the left side and the right side. In this way, the plurality of wires 4 in the other group of wires are arranged over the to-be-shielded component 2 in the B direction. In this way, two groups of wires cross to jointly form a grid-like shield layer.

A set included angle α is formed between the A direction and the B direction. In this embodiment of the present invention, the set included angle α is 90°. In other words, the A direction is perpendicular to the B direction. In another embodiment, the set included angle α ranges from 0° to 90°, and an appropriate angle may be selected based on requirements.

In the foregoing embodiments, the to-be-shielded component 2 may be an SMD, a chip, or a filter component in various package forms, which may be selected based on requirements.

In the foregoing embodiments, when each ground pad 3 is disposed in a respective ground hole 11, preferably, two ends of each ground pad 3 extend out of a corresponding ground hole 11. This facilitates connections between the ground pads 3 and the wires 4, and grounding operations of the ground pads 3, thereby improving convenience of the connections.

In the foregoing embodiments, a height of each wire 4 is adjustable, so that a distance between the shield layer and the to-be-shielded component 2 is adjustable. In this way, the electromagnetic shielding structure can be made lighter and thinner, thereby facilitating extensive application of the electromagnetic shielding structure in current ultra-thin and compact communication terminals.

Figure 5:
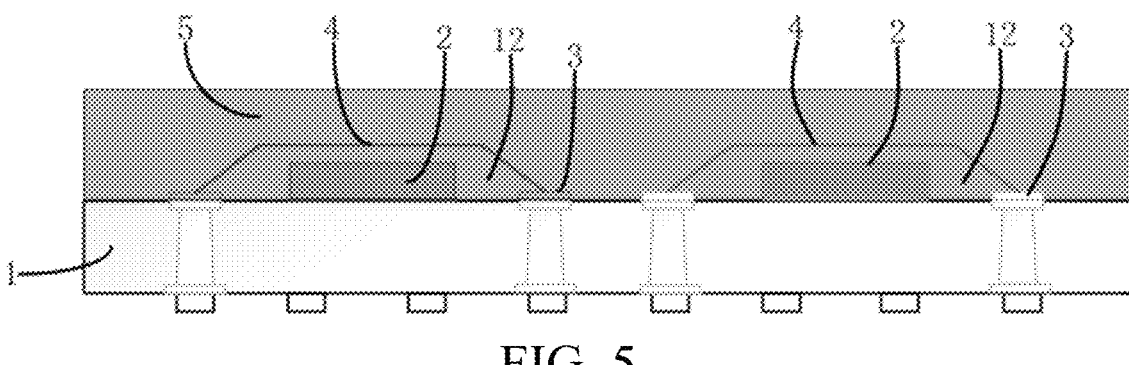
FIG. 5 is a schematic diagram of a structure of another electromagnetic shielding structure according to a fourth embodiment.

In the foregoing embodiments, the electromagnetic shielding structure further includes a plastic package body 5 (as shown in FIG. 5). The plastic package body 5 is injection molded on the module substrate 1 to seal the shield layer and the to-be-shielded component 2. Specifically, the plastic package body 5 is a plastic material. When the shield layer over the module substrate 1 is formed, the plastic material is injection molded on the module substrate 1 to seal the shield layer and the to-be-shielded component 2 between the module substrate 1 and the plastic package body 5. Therefore, the plastic package body 5 can be used to protect the shield layer and the to-be-shielded component 2 inside the plastic package body from being damaged, and can prevent unnecessary objects from falling into the to-be-shielded component 2, to improve safety in use of the electromagnetic shielding structure.

In conclusion, in the electromagnetic shielding structure provided in embodiments of the present invention, a good shielding effect can be achieved by using the shield layer formed by the plurality of wires 4. In this way, an impact of outward radiation of a signal of the to-be-shielded component 2 on another chip can be reduced, and an impact of another chip on the to-be-shielded component 2 can also be reduced. In addition, the wires 4 of the electromagnetic shielding structure can be implemented by common wire bonding without increasing costs of the electromagnetic shielding structure. In addition, for the electromagnetic shielding structure in embodiments of the present invention, there is no need to add additional shielding materials or package processes, so that the manufacturing process is simple, thereby improving convenience and efficiency of production. Finally, a height of each wire 4 is adjustable, so that a distance between the shield layer and the to-be-shielded component 2 is adjustable. In this way, the electromagnetic shielding structure can be made lighter and thinner, thereby facilitating extensive application of the electromagnetic shielding structure in current ultra-thin and compact communication terminals.

Figure 3:
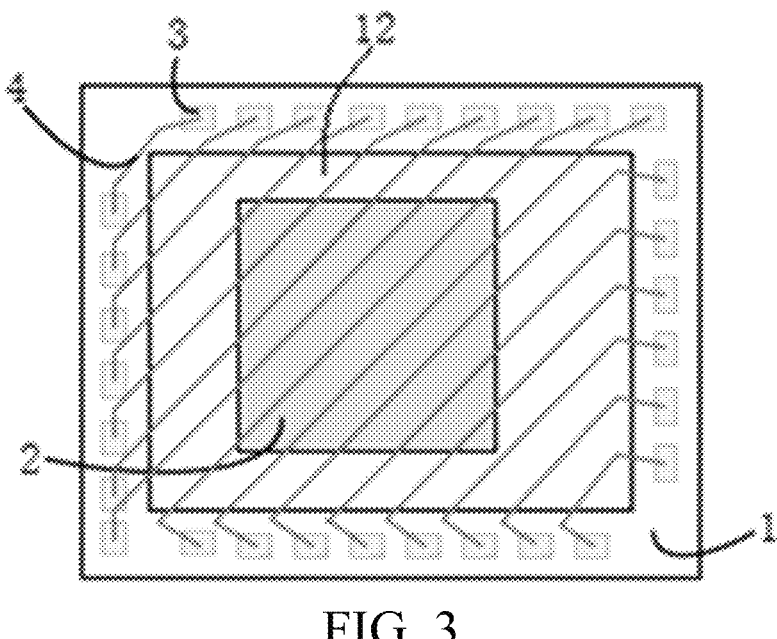
FIG. 3 is a schematic diagram of a structure of another electromagnetic shielding structure according to a second embodiment.

FIG. 3 shows another electromagnetic shielding structure provided in a second embodiment, including at least a module substrate 1, a to-be-shielded component 2, a plurality of ground pads 3, a plurality of wires 4, and a plastic package body 5 (as shown in FIG. 5). Compared with the first embodiment, this embodiment of the present invention is different in that specific connections of the plurality of wires 4 and the plurality of ground pads 3 are different, so that a shield layer in a different form is formed.

In this embodiment of the present invention, the module substrate 1 is in a rectangular shape. A plurality of ground holes 11 are provided on four sides (that is, an upper side, a lower side, a left side, and a right side) of the rectangular module substrate 1, to jointly define a rectangular mounting area 12. In addition, two ends of each wire 4 cross over the to-be-shielded component 2 in a C direction, and are respectively connected to two ground pads 3 of two the module substrate 1 on two adjacent sides.

Specifically, orientations are shown in FIG. 3. Two ends of each wire 4 of some wires are respectively connected to the ground pads 3 on the upper side and the left side, and two ends of each wire 4 of remaining wires are respectively connected to the ground pads 3 on the lower side and the right side, to jointly form a shield layer arranged over the to-be-shielded component 2. In the shield layer, the wires 4 are parallel to each other. In addition, it may be understood that in another embodiment, the plurality of wires 4 may alternatively be neither parallel nor intersecting, or some wires are parallel to each other, and remaining wires are neither parallel nor intersecting.

In this embodiment of the present invention, other structures than the foregoing structure are the same as those in the first embodiment. Details are not described herein again.

Figure 4:
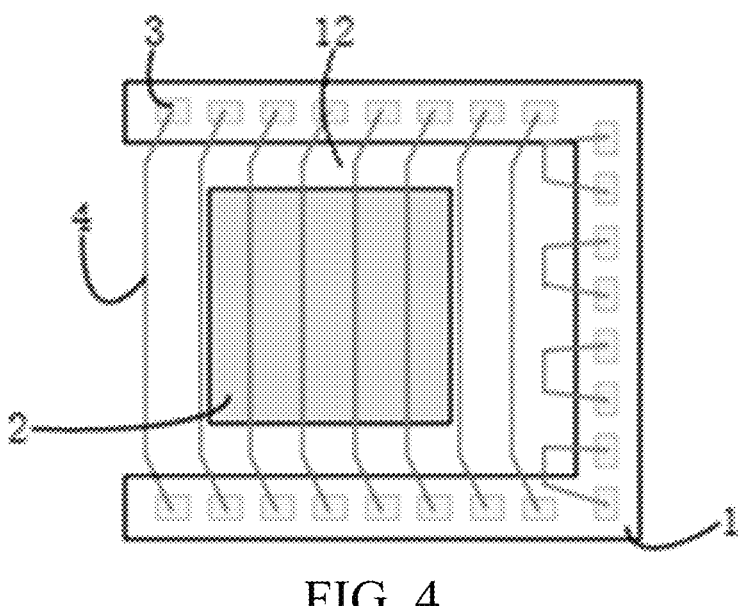
FIG. 4 is a schematic diagram of a structure of another electromagnetic shielding structure according to a third embodiment.

FIG. 4 shows another electromagnetic shielding structure provided in a third embodiment, including at least a module substrate 1, a to-be-shielded component 2, a plurality of ground pads 3, a plurality of wires 4, and a plastic package body 5 (as shown in FIG. 5). Compared with the first embodiment, this embodiment of the present invention is different in that a mounting area 12 defined on the module substrate 1 is an open area.

In embodiments of the present invention, the open area means that an overall shape jointly defined by a plurality of ground holes 11 is an open shape. For example, the plurality of ground holes 11 jointly define a U-shape, a V-shape, a semicircular shape, and the like. In addition, it may be understood that for the plurality of ground holes 11 that define the mounting area 12, a specific interval exists between two adjacent ground holes 11, for example, 1 cm to 2 cm. The interval may be adjusted adaptively based on requirements and does not affect an overall shape of the mounting area 12.

Specifically, in this embodiment of the present invention, the module substrate 1 is in a rectangular shape. The plurality of ground holes 11 are provided on three sides (that is, an upper side, a lower side, and a right side) of the rectangular module substrate 1, and no ground holes 11 are provided on a left side of the module substrate 1. In this way, the plurality of ground holes 11 jointly define the U-shaped mounting area 12. In addition, the plurality of wires 4 are divided into two groups. In one group of wires, two ends of each wire 4 cross over the to-be-shielded component 2 in a D direction, and are respectively connected to two ground pads 3 on the upper side and the lower side. In this way, the plurality of wires 4 in one group of wires are arranged over the to-be-shielded component 2 in the D direction. In another group of wires, two ends of each wire 4 are respectively connected to two adjacent ground pads 3 on the right side. In this way, two groups of wires jointly form a shield layer in a shape shown in FIG. 4.

In this embodiment of the present invention, other structures than the foregoing structure are the same as those in the first embodiment. Details are not described herein again.

FIG. 5 shows another electromagnetic shielding structure is provided in a fourth embodiment, including at least a module substrate 1, to-be-shielded components 2, a plurality of ground pads 3, a plurality of wires 4, and a plastic package body 5. Compared with the first embodiment, this embodiment of the present invention is different in that there are a plurality of mounting areas 12 in this embodiment of the present invention, so that a plurality of to-be-shielded components 2 may be mounted.

Specifically, in this embodiment of the present invention, a plurality of ground holes 11 are divided into M groups. Each group of ground holes 11 define a mounting area 12. The mounting areas 12 are not overlapped with each other. Correspondingly, there are two to-be-shielded components. The two to-be-shielded components 2 are located in the two mounting areas 12 respectively. Therefore, the plurality of to-be-shielded components 2 may be mounted on a same module substrate 1. A corresponding shield layer is formed over each to-be-shielded component 2. The to-be-shielded components 2 do not interfere with each other.

It may be understood that in another embodiment, the plurality of ground holes may be divided into three or more groups, to enable three or more to-be-shielded component 2 to be mounted on a same module substrate 1. Specific designs may be performed based on actual needs.

In addition, in different embodiments of the present invention, shapes of the mounting areas 12 may be the same or different. An example in which there are two mounting areas 12 on the module substrate 1 is used for description. In an embodiment, one mounting area 12 is a rectangular enclosed area, and the other mounting area 12 is a circular enclosed area. In another embodiment, one mounting area 12 is a rectangular enclosed area, and the other mounting area 12 is a U-shaped open area. In still another embodiment, both two mounting areas 12 are rectangular enclosed areas. In yet another embodiment, both two mounting areas 12 are U-shaped open areas.

Figure 6:
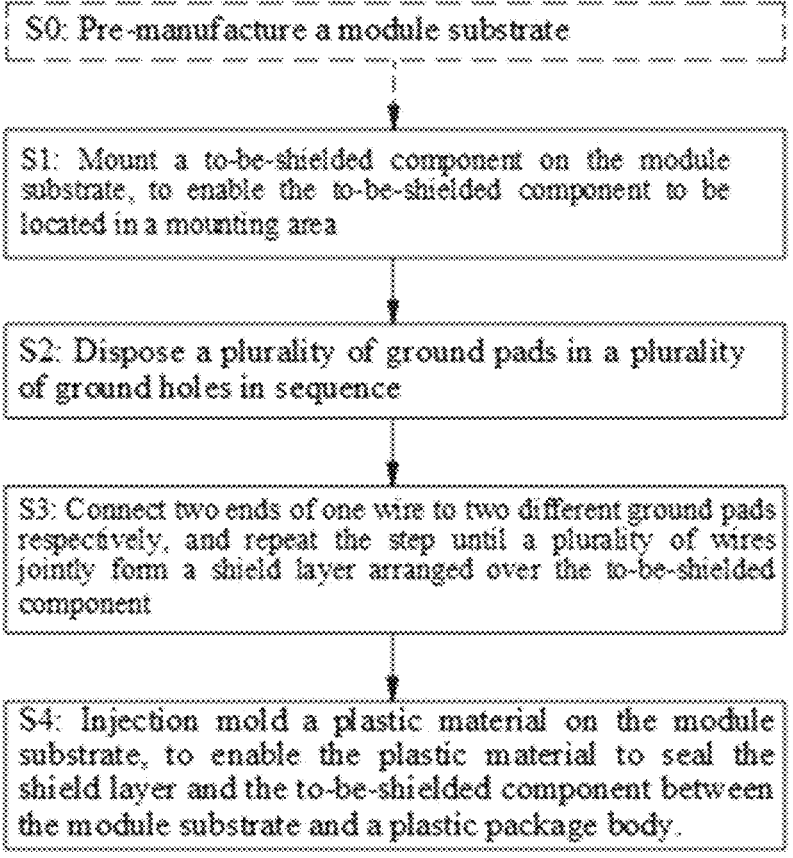
FIG. 6 is a flowchart of a manufacturing method for an electromagnetic shielding structure according to an embodiment of the present invention.

As shown in FIG. 6, the present invention further provides a manufacturing method for an electromagnetic shielding structure, and is used for manufacturing the electromagnetic shielding structure provided in any one of the foregoing embodiments. The manufacturing method specifically includes the following steps:

S1: Mount a to-be-shielded component 2 on a module substrate 1, to enable the to-be-shielded component 2 to be located in a mounting area 12 of the module substrate 1.

A quantity of the to-be-shielded components 2 corresponds to a quantity of the mounting areas 12. If there is only one mounting area 12 in step S1, there is one to-be-shielded component 2, and if a plurality of mounting areas 12 are formed in step S1, there are a plurality of to-be-shielded components 2.

S2: Dispose a plurality of ground pads 3 in a plurality of ground holes 11 in sequence.

S3: Connect two ends of one wire 4 to two different ground pads 3 respectively, and repeat the step until a plurality of wires 4 jointly form a shield layer arranged over the to-be-shielded component 2.

It may be understood that positions of the ground pads 3 connected to the wires 4 determine a final shape of the shield layer. Specific shapes may be selected adaptively based on requirements.

S4: Injection mold a plastic material on the module substrate 1, to enable the plastic material to seal the shield layer and the to-be-shielded component 2 between the module substrate 1 and a plastic package body 5.

Therefore, a manufacturing process of the electromagnetic shielding structure is completed. In this way, there is no need to add additional shielding materials or package processes, so that the manufacturing process is simple, thereby improving convenience and efficiency of production.

It may be understood that before the electromagnetic shielding structure is manufactured, step S0 may be performed: pre-manufacture a module substrate 1. A plurality of ground holes 11 running through the module substrate 1 are provided on the pre-manufactured module substrate 1, and the plurality of ground holes 11 jointly define a mounting area 12. A quantity of the mounting areas 12 may be one or more.

After the module substrate 1 is pre-manufactured, the electromagnetic shielding structure can be manufactured by steps S1 to S4. It may be understood that step S0 is merely a precondition for manufacturing the electromagnetic shielding structure. Step S0 may be a step of the entire manufacturing method, or may be independent of the entire manufacturing method. If step S0 is a step of the entire manufacturing method, in the entire manufacturing method, the module substrate 1 needs to be first manufactured by step S0, and then the electromagnetic shielding structure is manufactured by steps S1 to S4. If step S0 is independent of the entire manufacturing method, the pre-manufactured module substrate 1 may be directly purchased. The module substrate 1 is merely a component for manufacturing the electromagnetic shielding structure, and the manufacturing method S0 of the component is not related to the manufacturing method of the electromagnetic shielding structure.

Based on the electromagnetic shielding structure provided in the foregoing embodiments, the present invention further provides a communication terminal. The communication terminal herein refers to a computer device that can be used in a mobile environment and supports a plurality of communications standards, such as GSM, EDGE, TD_SCDMA, TDD_LTE, and FDD_LTE, including a mobile phone, a notebook computer, a tablet computer, a vehicle-mounted computer, and the like. In embodiments of the present invention, the communication terminal includes any electromagnetic shielding structure according to the first embodiment to the fourth embodiment, to facilitate reduction of entire manufacturing costs of the communication terminal.

The foregoing describes the electromagnetic shielding structure, the manufacturing method, and the communication terminal provided in the present invention in detail. Any obvious modification made to the present invention by a person of ordinary skill in the art without departing from contents of the present invention will constitute an infringement of the patent right of the present invention, and those of ordinary skill who make such modification shall bear corresponding legal liabilities.

What is claimed is:

1. An electromagnetic shielding structure, comprising:
   a module substrate, wherein a plurality of ground holes running through the module substrate are provided on the module substrate, and the plurality of ground holes are arranged on all four sides of the module substrate to jointly define a mounting area, wherein the mounting area is an enclosed area or an open area;
   a to-be-shielded component, mounted on the module substrate and located in the mounting area;
   a plurality of ground pads, wherein each ground pad is disposed in a respective ground hole, and both ends of each ground pad extend out of the corresponding ground hole; and
   a plurality of wires, wherein the plurality of wires are divided into a first group and a second group; wherein
   two ends of each wire in the first group are respectively connected to two different ground pads on a first pair of opposite sides of the module substrate, such that the wires of the first group are arranged over the to-be-shielded component in a first direction;
   two ends of each wire in the second group are respectively connected to two different ground pads on a second pair of opposite sides of the module substrate, such that the wires of the second group are arranged over the to-be-shielded component in a second direction;
   the wires of the first group and the second group cross each other to jointly form a grid-like shield layer over the to-be-shielded component, and a set included angle α is formed between the first direction and the second direction.

2. The electromagnetic shielding structure according to claim 1, wherein
   the plurality of ground holes are divided into M groups, each group of ground holes defines a mounting area, the mounting areas are not overlapped with each other, and M is a positive integer greater than 1.

3. The electromagnetic shielding structure according to claim 2, wherein
   a quantity of the to-be-shielded components is M, and each to-be-shielded component is located in a respective one of the mounting areas.

4. The electromagnetic shielding structure according to claim 1, wherein a value of the set included angle α ranges from 0° to 90°.

5. The electromagnetic shielding structure according to claim 1, wherein
   the mounting area is an open area, the plurality of wires are divided into two groups, each wire in one group of wires is arranged over the to-be-shielded component in a third direction, and each wire in the other group of wires is connected between two adjacent ground pads.

6. The electromagnetic shielding structure according to claim 1, wherein a height of each wire is adjustable, so that a distance between the shield layer and the to-be-shielded component is adjustable.

7. The electromagnetic shielding structure according to claim 1, further comprising a plastic package body, wherein the plastic package body is injection molded on the module substrate to seal the shield layer and the to-be-shielded component.

8. A communication terminal, comprising the electromagnetic shielding structure according to claim 1.

9. A manufacturing method for an electromagnetic shielding structure, comprising the following steps:

providing a rectangular module substrate, and forming a plurality of ground holes running through the module substrate on all four sides of the rectangular module substrate, so that the plurality of ground holes jointly define an enclosed mounting area or an open mounting area;

mounting a to-be-shielded component on the module substrate, so that the to-be-shielded component is located in the mounting area of the module substrate;

disposing a plurality of ground pads in the plurality of ground holes of the module substrate in sequence, and enabling both ends of each ground pad to extend out of the corresponding ground hole;

dividing a plurality of wires into two groups, wherein two ends of each wire in one group of wires cross over the to-be-shielded component in a first direction and are connected to two ground pads on the upper and lower sides respectively, so that the plurality of wires in the one group are arranged over the to-be-shielded component in the first direction; and two ends of each wire in the other group of wires cross over the to-be-shielded component in a second direction and are connected to two ground pads on the left and right sides respectively, so that the plurality of wires in the other group are arranged over the to-be-shielded component in the second direction, thereby jointly forming a grid-like shield layer through the crossing of the two groups of wires to replace additional shielding materials; wherein a set included angle α is formed between the first direction and the second direction; and based on product requirements, adjusting a height of each wire, thereby adjusting a distance between the grid-like shield layer and the to-be-shielded component;

injection molding a plastic material directly on the module substrate to seal the shield layer and the to-be-shielded component.

\* \* \* \* \*